(12) United States Patent
Kaneya et al.

(10) Patent No.: US 8,796,411 B2
(45) Date of Patent: Aug. 5, 2014

(54) POLYIMIDE PRECURSOR COMPOSITION, POLYIMIDE FILM, AND TRANSPARENT FLEXIBLE FILM

(75) Inventors: Yuichi Kaneya, Ibaraki (JP); Yumiko Arakawa, Ibaraki (JP); Keiko Suzuki, Ibaraki (JP)

(73) Assignee: Hitachi Chemical DuPont Microsystems, Ltd., Tokyo (JP)

( * ) Notice: Subject to any disclaimer, the term of this patent is extended or adjusted under 35 U.S.C. 154(b) by 219 days.

(21) Appl. No.: 12/918,312

(22) PCT Filed: Jan. 26, 2009

(86) PCT No.: PCT/JP2009/051170
§ 371 (c)(1),
(2), (4) Date: Nov. 17, 2010

(87) PCT Pub. No.: WO2009/107429
PCT Pub. Date: Sep. 3, 2009

(65) Prior Publication Data
US 2011/0059305 A1    Mar. 10, 2011

(30) Foreign Application Priority Data
Feb. 25, 2008    (JP) ................................. 2008-043350

(51) Int. Cl.
C08G 73/00    (2006.01)

(52) U.S. Cl.
USPC ............. 528/170; 528/30; 528/310; 528/380; 549/50

(58) Field of Classification Search
USPC ................. 528/170, 30, 380; 549/50
See application file for complete search history.

(56) References Cited

U.S. PATENT DOCUMENTS 5,571,579 A * 11/1996 Kato et al. .................. 428/1.25
2008/0138537 A1    6/2008 Simone et al.

FOREIGN PATENT DOCUMENTS

| EP | 1 749 850 A1 | 2/2007 |
| JP | 08-104750 | 4/1996 |
| JP | 11-080350 | 3/1999 |
| JP | 11-231532 | 8/1999 |
| JP | 2002-161136 | 6/2002 |
| JP | 2002-167433 A | 6/2002 |
| JP | 2002-322274 A | 11/2002 |
| JP | 2002-327056 A | 11/2002 |
| JP | 2004-307857 | 11/2004 |
| JP | 2007-046054 | 2/2007 |
| JP | 2007-231224 A | 9/2007 |
| JP | 2008-031268 A | 2/2008 |
| JP | 2008-050567 | 3/2008 |
| TW | 200712098 A | 4/2007 |

OTHER PUBLICATIONS

Masatoshi Hasegawa et al., "Spontaneous Molecular Orientation of Polyimides Induced by Thermal Imidization. 2. In-Plane Orientation," Macromolecules 1996, vol. 29, pp. 7897-7909.
Tohru Matsuura et al., "Polyimide Derived From 2, 2'-Bis (trifluoromethyl)-4,4'-diaminobiphenyl. 1. Synthesis and Characterization of Polyimides Prepared with 2,2-Bis(3-,4-dicarboxyphenyl) . . . ", Macromolecules 1991, vol. 24, pp. 5001-5005.
Tomohito Ogura et al., "Facile Synthesis of Semiaromatic Poly(amic acid)s from trans-1,4-Cyclohexanediamine and Aromatic Tetracarboxylic Dianhydrides," Macromoleules 2007, vol. 40, pp. 3527-3529.
Yasufumi Watanabe et al.,"Synthesis of Wholly Alicyclic Polyimides from N-Silylated Alicyclic Diamines and Alicyclic Dianhydrides," Macromolecules 2002, vol. 35, pp. 2277-2281.
International Search Report issued in corresponding application No. PCT/JP2009/051170, completed Feb. 9, 2009, mailed Feb. 24, 2009.
Office Action issued on Nov. 17, 2011 in the corresponding Chinese Patent Application No. 200980106307.7.
Trans-1,4-cyclohexyldiamine, 2615-25-0, downloaded from http://www.chiralblock.com on Oct. 14, 2012.
Patent Abstracts of Japan English Abstract corresponding to JP 08-104750, which was downloaded on Mar. 19, 2010, filed herewith as Exhibit B0.
Hawley's Condensed Chemical Dictionary 330 (1987), filed herewith as Exhibit B1.
McGraw-Hill Dictionary of Scientific and Technical Terms (6th Edition) 526 (2003), filed herewith as Exhibit C1.
Extended European Search Report issued in co-pending related application EP 09714515.5, completed Jun. 14, 2013 and mailed Jun. 25, 2013.
Decision of a Patent Grant issued the corresponding Japanese application 2010-500610, issued Sep. 10, 2013 and mailed Sep. 17, 2013.

* cited by examiner

Primary Examiner — Gregory Listvoyb
(74) Attorney, Agent, or Firm — Griffin & Szipl, P.C.

(57) ABSTRACT

The polyimide precursor composition of the present invention is characterized in comprising a polyimide precursor having a structure formed by reacting a diamine component (A) containing a fluorine-containing aromatic diamine (a1) represented by the following chemical formula (I)

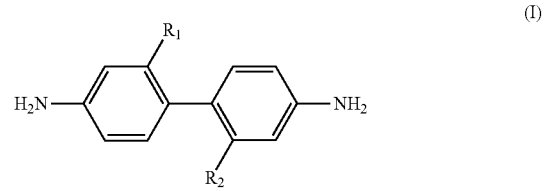

(in the formula (I), $R_1$ and $R_2$ are each independently selected from —H, —$(CF_2)_n$—$CF_3$, and —O$(CF_2)_n$—$CF_3$ (n is an integer of 0 or more and 7 or less), and at least one of $R_1$ and $R_2$ is a fluorine-containing group) and trans-1,4-cyclohexyldiamine (a2) with an acid dianhydride component (B) containing an aliphatic tetracarboxylic dianhydride (b1) and an aromatic tetracarboxylic dianhydride (b2). Use of the composition of the present invention provides a polyimide film and a transparent flexible film having high transparency, low thermal expansion properties, low birefringent properties, and high heat resistance.

16 Claims, No Drawings

POLYIMIDE PRECURSOR COMPOSITION, POLYIMIDE FILM, AND TRANSPARENT FLEXIBLE FILM

This is a National Phase Application in the United States of International Patent Application No. PCT/JP2009/051170 filed Jan. 26, 2009, which claims priority on Japanese Patent Application No. 2008-043350, filed Feb. 25, 2008. The entire disclosures of the above patent applications are hereby incorporated by reference.

TECHNICAL FIELD

The present invention generally relates to a polyimide precursor composition used to form a polyimide film having high transparency, low thermal expansion properties, high heat resistance, and low birefringent properties, and to a polyimide film obtained by the imide ring closure reaction of the polyimide precursor composition. The present invention also relates to a transparent flexible film obtained using the polyimide-based film and used for electronic devices such as electronic displays (e.g., electronic paper), organic EL display devices, LED (light-emitting diode) lighting devices, and CMOS (complementary metal oxide semiconductor) sensors.

BACKGROUND ART

Polyimide films have good mechanical properties and other good characteristics such as heat resistance, chemical resistance, and electrical insulation properties and are therefore widely used as various films for optical waveguides and electronic devices such as interlayer dielectric films for semiconductors, buffer coatings, flexible printed circuit substrates, and liquid-crystal alignment films.

At present, glass is widely used for substrates for, e.g., liquid crystal display devices, organic EL display devices, and organic TFTs. However, with the trend toward weight reduction and flexibilization, flexible substrates produced using plastics such as PEN (polyethylene naphthalate) and PES (polyethersulfone) are being developed. The basic characteristics of flexible substrates that can be used as alternatives to glass substrates may include, e.g., high transparency, low thermal expansion properties, high thermal resistance, and low birefringent properties.

The substrate having the basic characteristics must satisfy the following specific requirements. The transmittance of 400 nm light at a film thickness of 10 μm must be 80% or more. In order to prevent improper arrangement of display pixels and wiring traces on a substrate due to expansion and contraction of the substrate, the thermal expansion coefficient must be 20 ppm/° C. or less in the range of 100° C. to 200° C. As to the birefringent properties, the difference between the refractive index in TE (Transverse Electric) mode and the refractive index in TM (Transverse Magnetic) mode must be 0.05 or less. The glass transition temperature must be 250° C. or more.

At present, the most well-known example of practical low-thermal expansion polyimide materials is a polyimide produced from 3,3',4,4'-biphenyltetracarboxylic dianhydride and p-phenylenediamine. It is known that a film obtained from this polyimide exhibits a very low thermal expansion coefficient (5 to 10 ppm/° C.), although the value may vary depending on the thickness and production conditions (for example, Non-Patent Document 1). However, the light transmittance of this polyimide film is substantially 0% at 400 nm.

It is known that the introduction of a highly flexible monomer or a fluorine substituent into the skeleton is effective to obtain a highly transparent polyimide film. For example, Non-Patent Document 2 reports a perfluoro polyimide obtained from 2,2-bis(3,4-carboxyphenyl)hexafluoropropanoic dianhydride (a fluorinated acid dianhydride) and 2,2'-bis(trifluoromethyl)benzidine (a fluorinated diamine). A film obtained from the aforementioned perfluoro polyimide exhibits a light transmittance as high as 85% when the light is at 400 nm and the thickness of the film is 20 μm. However, the thermal expansion coefficient of the film is as high as 48 ppm/° C., and the film does not satisfy the requirement for the low thermal expansion properties.

Non-Patent Document 2 also reports a polyimide obtained from pyromellitic dianhydride and 2,2'-bis(trifluoromethyl)benzidine. A film obtained from this polyimide exhibits good low thermal expansion properties with a thermal expansion coefficient of 3 ppm/° C. However, the transmittance of 400 nm light through the film having a thickness of 20 μm is 10%, which does not satisfy the requirement for the high light transmittance.

Patent Document 1 reports a polyimide produced from 3,3',4,4'-biphenyltetracarboxylic dianhydride and trans-1,4'-cyclohexyldiamine. A film produced from this polyimide has good light transmittance such that the 1% cutoff wavelength is 368 nm when the thickness of the film is 5 μm. However, its thermal expansion coefficient is 23 ppm/° C., which does not satisfy the requirement for the low thermal expansion properties.

Patent Document 2 reports a polyimide produced from 3,3',4,4'-biphenyltetracarboxylic dianhydride and 2,2'-bis(trifluoromethyl)benzidine. In Patent Document 2, a polyimide film obtained using an ordinary thermal conversion method has good light transmitting properties such that the transmittance of 380 nm wavelength light through the film having a thickness of 3 mil (=75 μm) is 78%. However, its thermal expansion coefficient is as high as 38 ppm/° C., which does not satisfy the requirement for the low thermal expansion properties. A polyimide film obtained using a chemical conversion method has good light transmitting properties such that the transmittance of 380 nm wavelength light through the film having a thickness of 3 mil (=75 μm) is 76%, and the film also has low thermal expansion properties such that the thermal expansion coefficient is −3 ppm/° C. However, the chemical conversion method essentially requires a step of removing a catalyst upon forming the film, and therefore this method is not suitable for mass production.

Patent Document 3 reports a polyimide produced from 3,3',4,4'-dicyclohexyl tetracarboxylic dianhydride and 4,4'-diaminodiphenyl ether. In Patent Document 3, a polyimide film obtained using an ordinary thermal conversion method cured at 300° C. and having a thickness of 35 μm has a good light transmittance of 83% at 500 nm. However, the problem thereof is that its glass transition temperature is 244° C., which is not high enough and does not fall within the target range.

[Non-Patent Document 1] Macromolecules, Vol. 29, 1996, pp. 7897-7909

[Non-Patent Document 2] Macromolecules, Vol. 24, 1991, pp. 5001-5005

[Patent Document 1] Japanese Patent Application Laid-Open No. 2002-161136 A

[Patent Document 2] Japanese Patent Application Laid-Open No. 2007-046054 A

[Patent Document 3] Japanese Patent Application Laid-Open No. Hei 08-104750 A

DISCLOSURE OF THE INVENTION

Problems to be Solved by the Invention

As described above, polyimides are known as organic polymer materials that can form transparent flexible films having high heat resistance and can be candidate materials for various transparent flexible films for electronic devices. However, at present, such polyimides do not meet all the basic characteristics necessary for transparent flexible films for electronic devices.

Recently, novel electronic devices including electronic displays such as electronic paper, organic EL display devices, LED (light-emitting diode) lighting devices, and CMOS (complementary metal oxide semiconductor) sensors are being rapidly developed and commercialized. Likewise, when conventional polyimide films are used as transparent flexible films for the aforementioned novel electronic devices, i.e., as the transparent flexible substrates for electronic display devices including electronic displays such as electronic paper and organic EL display devices and as the protection films for LED (light-emitting diode) lighting devices and CMOS (complementary metal oxide semiconductor) sensors), the polyimide films must meet all the aforementioned basic characteristics. However, polyimide films having such good characteristics have not been provided.

The present invention has been made in view of the aforementioned circumstances. It is an object of the invention to provide a polyimide precursor composition for obtaining a polyimide film having high transparency, low thermal expansion properties, high heat resistance, and low birefringent properties, and a polyimide film obtained by the imide ring closure reaction of the polyimide precursor composition. It is another object of the invention to provide a transparent flexible film obtained using the polyimide-based film and used for electronic devices including electronic displays such as electronic paper, organic EL display devices, LED (light-emitting diode) lighting devices, CMOS (complementary metal oxide semiconductor) sensors, and the like.

Means for Solving the Problems

The present inventors have made extensive studies to achieve the aforementioned objects and found out that the aforementioned objects can be achieved by a polyimide film obtained by the imide ring closure reaction of a polyimide precursor composition containing a polyimide precursor having a specific structure. Thus the present invention has been completed.

That is, the polyimide precursor composition according to the present invention is characterized in that the composition comprises a polyimide precursor having a structure formed by reacting a diamine component (A) containing a fluorine-containing aromatic diamine (a1) represented by the following chemical formula (I)

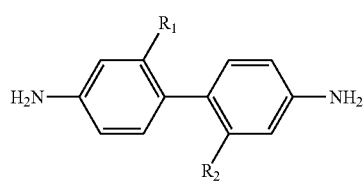
(I)

(in the formula (I), $R_1$ and $R_2$ are each independently selected from —H, —$(CF_2)_n$—$CF_3$, and —$O(CF_2)_n$—$CF_3$ (n is an integer of 0 or more and 7 or less), and at least one of $R_1$ and $R_2$ is a fluorine-containing group) and trans-1,4-cyclohexyldiamine (a2) with an acid dianhydride component (B) containing an aliphatic tetracarboxylic dianhydride (b1) and an aromatic tetracarboxylic dianhydride (b2).

The polyimide precursor formed as described above generally has a structure represented by the following formula (II) in which, as a result of reaction of diamine component and acid dianhydride component, these components are bonded alternately:

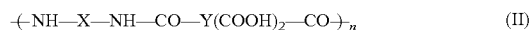

[in the formula (II), X is a part of the structure of the diamine component (a1) or (a2) which is the structure thereof other than two amino groups, Y is a part of the structure of the acid dianhydride component (b1) or (b2) which is the structure thereof other than two acid anhydride groups, n is the number of repetitions, and the overall structure includes two types of X's originating from (a1) and (a2) and two types of Y's originating from (b1) and (b2)].

As long as it has the structure represented by the aforementioned formula (II), the polyimide precursor in the present invention may be the one that has produced from other materials. Therefore, specifying on the basis of its structure, the polyimide precursor in the present invention is defined as a polyimide precursor having a structure represented by the following general formula (III)

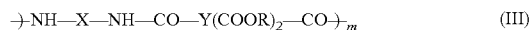

(in the formula (III), m is a natural number representing the number of repetitions of the structural unit, each of m X's is independently a divalent organic group, and the polyimide precursor comprises, as X's, both a group represented by the following general formula (IV)

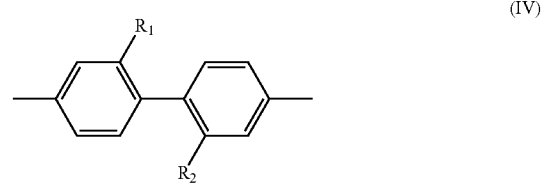
(IV)

and a trans-1,4-cyclohexylene group. $R_1$ and $R_2$ in the formula (IV) are each independently one selected from —H, —$(CF_2)_n$—$CF_3$, and —$O(CF_2)_n$—$CF_3$ (n is an integer of 0 or more and 7 or less), and at least one of $R_1$ and $R_2$ is a fluorine-containing group. In the formula (III), each of m Y's is independently a tetravalent organic group, the polyimide comprises as Y's both an aliphatic group and an aromatic group, and each of 2m R's is independently a hydrogen atom or a monovalent organic group).

In the polyimide precursor composition having the aforementioned features, it is preferable that the diamine component (A) which is the material for the polyimide precursor contains the fluorine-containing aromatic diamine (a1) in an amount of 5 mol % or more and 95 mol % or less and the trans-1,4-cyclohexyldiamine (a2) in an amount of 95 mol % or less and 5 mol % or more. The diamine component (A) may further contain another diamine compound as the remainder of the aforementioned amounts of the fluorine-containing aromatic diamine (a1) and the trans-1,4-cyclohexyldiamine (a2). The preferred ratio of the aforementioned constituent components in the structure (general formula (III)) of the polyimide precursor is the same as the aforementioned preferred amounts of the components used as the raw materials.

In the polyimide precursor composition having the aforementioned features, it is preferable that the acid dianhydride component (B) which is the material for the polyimide precursor contains the aliphatic tetracarboxylic dianhydride (b1) in an amount of 5 mol % or more and 95 mol % or less and the aromatic tetracarboxylic dianhydride (b2) in an amount of 95 mol % or less and 5 mol % or more. The acid dianhydride component (B) may further contain another acid dianhydride as the remainder of the aforementioned amounts of the aliphatic tetracarboxylic dianhydride (b1) and the aromatic tetracarboxylic dianhydride (b2). The preferred ratio of the aforementioned constituent components in the structure (general formula (III)) of the polyimide precursor is the same as the aforementioned preferred amounts of the components used as the raw materials.

In the present invention, the term "aliphatic tetracarboxylic dianhydride" (b1) means in a broad sense which does not only include an aliphatic tetracarboxylic dianhydride in a narrow sense but also includes alicyclic tetracarboxylic dianhydrides in a broad sense. Therefore, the term "aliphatic group" in Y in the general formulas (II) and (III) is used to include alicyclic structures in a broad sense. In the polyimide precursor composition, the aliphatic tetracarboxylic dianhydride (b1) may be 3,3',4,4'-bicyclohexyl tetracarboxylic dianhydride, and the aromatic tetracarboxylic acid dianhydride (b2) may be 3,3',4,4'-biphenyltetracarboxylic dianhydride.

In the polyimide precursor composition of the present invention, it is preferable that the ratio (A/B) of the number of moles of the diamine component (A) with respect to the number of moles of the acid dianhydride component (B) is 0.9 to 1.1.

The polyimide precursor composition of the present invention is usually prepared by adding a solvent component (C) to a polyimide precursor having a structure formed by the reaction of the component (A) with the component (B) (in terms of structure, a polyimide precursor having the structure represented by the aforementioned general formula (III)). If necessary, the polyimide precursor composition may contain other components.

A polyimide film of the present invention is obtained by using the aforementioned polyimide precursor composition and is characterized in having a transmittance of 400 nm light of 80% or more at a film thickness of 10 μm, a thermal expansion coefficient of 20 ppm/° C. or less in the range of 100° C. to 200° C., and a glass transition temperature of 250° C. or more.

Preferably, the polyimide film of the present invention has birefringent properties in which the difference between the refractive index in TE mode and the refractive index in TM mode is 0.05 or less.

A transparent flexible film of the present invention is characterized in that the film is obtained using the aforementioned polyimide film. Preferably, the transparent flexible film of the present invention is the transparent flexible substrate of an electronic display device, the protection film of a lighting device, or the protection film of a photoelectronic sensor.

As evident from the above, the present invention provides a polyimide precursor composition, a polyimide film, and a transparent flexible film, features of which are as follows.

(1) A polyimide precursor composition comprising a polyimide precursor having a structure formed by reacting a diamine component (A) containing a fluorine-containing aromatic diamine (a1) represented by the following chemical formula (I)

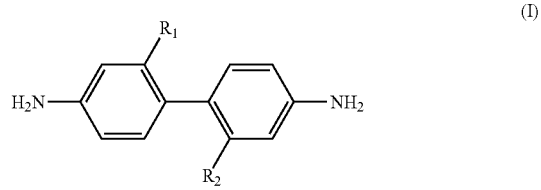

(in the formula (I), $R_1$ and $R_2$ are each independently selected from —H, —$(CF_2)_n$—$CF_3$, and —$O(CF_2)_n$—$CF_3$ (n is an integer of 0 or more and 7 or less), and at least one of $R_1$ and $R_2$ is a fluorine-containing group) and trans-1,4-cyclohexyldiamine (a2) with an acid dianhydride component (B) containing an aliphatic tetracarboxylic dianhydride (b1) and an aromatic tetracarboxylic dianhydride (b2).

(2) The polyimide precursor composition according to (1) above, wherein the structure of the polyimide precursor is a structure represented by the following general formula

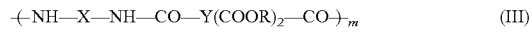

(in the formula (III), m is a natural number representing the number of repetitions of the structural unit, each of m X's is independently a divalent organic group, and the polyimide precursor comprises, as X's, both a group represented by the following general formula (IV)

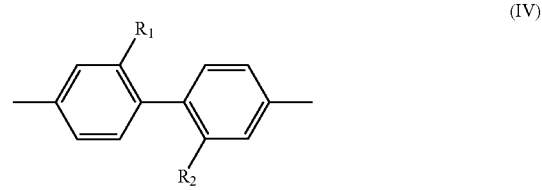

and a trans-1,4-cyclohexylene group, wherein $R_1$ and $R_2$ in the formula (IV) are each independently one selected from —H, —$(CF_2)_n$—$CF_3$, and —$O(CF_2)_n$—$CF_3$ (n is an integer of 0 or more and 7 or less), and at least one of $R_1$ and $R_2$ is a fluorine-containing group, and in the formula (III), each of m Y's is independently a tetravalent organic group, the polyimide comprises as Y's both an aliphatic group and an aromatic group, and each of 2m R's is independently a hydrogen atom or a monovalent organic group).

(3) The polyimide precursor composition according to (1) or (2) above, wherein the diamine component (A) contains the fluorine-containing aromatic diamine (a1) in an amount of 5 mol % or more and 95 mol % or less and the trans-1,4-cyclohexyldiamine (a2) in an amount of 95 mol % or less and 5 mol % or more.

(4) The polyimide precursor composition according to any one of (1) to (3) above, wherein the acid dianhydride component (B) contains the aliphatic tetracarboxylic dianhydride (b1) in an amount of 5 mol % or more and 95 mol % or less and the aromatic tetracarboxylic dianhydride (b2) in an amount of 95 mol % or less and 5 mol % or more.

(5) The polyimide precursor composition according to any one of (1) to (4), wherein the aliphatic tetracarboxylic dianhydride (b1) is 3,3',4,4'-bicyclohexyl tetracarboxylic dianhydride, and the aromatic tetracarboxylic acid dianhydride (b2) is 3,3',4,4'-biphenyltetracarboxylic dianhydride.

(6) The polyimide precursor composition according to any one of (1) to (5) above, wherein a ratio (A/B) of the number of moles of the diamine component (A) with respect to the number of moles of the acid dianhydride component (B) is 0.9 to 1.1.

(7) A polyimide precursor composition comprising a polyimide precursor having a structure represented by the following general formula (III)

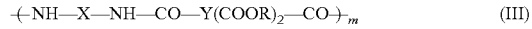

[in the formula (III), m is a natural number representing the number of repetitions of the structural unit, each of m X's is independently a divalent organic group, and the polyimide precursor comprises, as X's, both a group represented by the following general formula (IV)

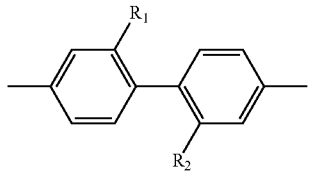

and a trans-1,4-cyclohexylene group, R₁ and R₂ in the formula (IV) are each independently one selected from —H, —(CF₂)$_n$—CF₃, and —O(CF₂)$_n$—CF₃ (n is an integer of 0 or more and 7 or less), and at least one of R₁ and R₂ is a fluorine-containing group, and in the formula (III), each of m Y's is independently a tetravalent organic group, the polyimide precursor comprises as Y's both an aliphatic group and an aromatic group, and each of 2m R's is independently a hydrogen atom or a monovalent organic group).

(8) A polyimide film obtained using the polyimide precursor composition according to any one of (1) to (7) above, wherein the polyimide film has a transmittance of 400 nm light of 80% or more at a film thickness of 10 μm, a thermal expansion coefficient of 20 ppm/° C. or less in the range of 100° C. to 200° C., and a glass transition temperature of 250° C. or more.

(9) The polyimide film according to (8) above, wherein a difference between the refractive index in TE mode and the refractive index in TM mode is 0.05 or less.

(10) A transparent flexible film obtained using the polyimide film according to (8) or (9) above.

(11) The transparent flexible film according to (10) above, wherein the transparent flexible film is a transparent flexible substrate for an electronic device.

(12) The transparent flexible film according to (10) above, wherein the transparent flexible film is a protection film for a lighting device.

(13) The transparent flexible film according to (10) above, wherein the transparent flexible film is a protection film for a photoelectric sensor.

Effect of the Invention

The polyimide precursor composition according to the present invention can form a polyimide film having high transparency, low thermal expansion properties, high heat resistance, and low birefringent properties. This polyimide film is suitable for the flexible substrates for electronic displays and organic EL lighting devices and the protection films for LEDs and CMOS sensors.

BEST MODE FOR CARRYING OUT THE INVENTION

The polyimide precursor composition according to the present invention is characterized in that the composition contains a polyimide precursor having the structure represented by the aforementioned general formula (III). As described above, this polyimide precursor is obtainable by reacting the aforementioned components (A) and (B). The polyimide precursor composition of the present invention is usually a preparation in which the polyimide precursor is dissolved in a solvent component (C) and, if necessary, may contain other components.

In the general formula (III) described above, each of m X's is independently a divalent organic group and is in general the remaining part other than the amino groups of a diamine which is used as a material. Therefore, the remaining part other than the amino groups of the diamine components, which will be explained later in detail, can be examples for the divalent organic group. In the present invention, X's essentially include both a group represented by the following general formula (IV)

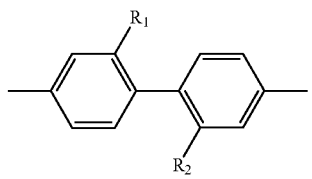

and a trans-1,4-cyclohexylene group (in the formula (IV), R₁ and R₂ are each independently one kind selected from —H, —(CF₂)$_n$—CF₃, and —O(CF₂)$_n$—CF₃ (n is an integer of 0 or more and 7 or less), and at least one of R₁ and R₂ is a fluorine-containing group). In the general formula (III), each of m Y's is independently a tetravalent organic group and is in general the remaining part other than the carboxyl groups of a tetracarboxylic acid (or an acid dianhydride thereof or a derivative thereof) used as a material. Therefore, the remaining part other than two anhydride groups of the acid dianhydride components (B), which will be described layer, can be examples for the tetravalent organic group. In the present invention, Y's essentially comprise both an aliphatic group and an aromatic group.

First, a description will be given of each of the components used to produce the polyimide precursor.
(Diamine Component (A))

Examples of the fluorine-containing aromatic diamine (a1) represented by the chemical formula (I), which is an essential ingredient of the diamine component (A) used in the present invention, may include: 2,2'-bis(trifluoromethyl)-benzidine, 2,2'-bis(trifluoromethoxy)-benzidine, 2-trifluoromethyl-benzidine, 2-trifluoromethoxy-benzidine, 2,2'-bis(pentafluoroethyl)-benzidine, 2,2'-bis(pentafluoroethoxy)-benzidine, 2-pentafluoroethyl-benzidine, 2-pentafluoroethoxy-benzidine, 2,2'-bis(heptafluoropropane)-benzidine, 2,2'-bis(heptafluoroproproxy)-benzidine, 2-heptafluoropropane-benzidine, 2-heptafluoroproproxy-benzidine, 2-pentafluoroethoxy-benzidine, 2,2'-bis(heptadecafluorooctane)-benzidine, 2,2'-bis(heptadecafluorooctoxy)-benzidine, 2-heptadecafluorooctane-benzidine, and 2-heptadecafluorooctoxy-benzidine. Of these, 2,2'-bis(trifluoromethyl)-benzidine is particularly preferred. One species thereof may be solely used, and two or more species thereof may also be used in combination. Preferably, the diamine component (A) contains the fluorine-containing aromatic diamine (a1) in an amount of 5 mol % or more, desirably 10 mol % or more, and more desirably 10 mol % or more and 95 mol % or less.

The trans-1,4-cyclohexyldiamine (a2), which is another essential ingredient of the diamine component (A) used in the present invention, has not only the effect of improving the transparency of a polyimide film but also the effect of improving its glass transition temperature. Preferably, the diamine component (A) contains the trans-1,4-cyclohexyldiamine (a2) in an amount of 5 mol % or more, desirably 30 mol % or more, and more desirably 50 mol % or more and 95 mol % or less. When unpurified trans-1,4-cyclohexyldiamine (a2) is used, the resultant polyimide film shows a deep color. Therefore, preferably, such unpurified trans-1,4-cyclohexyldiamine (a2) is purified by recrystallization from n-hexane or the like in accordance with need. It is known that trans-1,4-cyclohexyldiamine (a2) forms a salt when reacted with an acid dianhydride, which can be an obstacle to molecular weight increase. If necessary, it may be synthesized by a known method such as an acetic acid addition method (see, for example, Macromolecules, Vol. 40, 2007, pp. 3527) or an N-silylation method (see, for example, Macromolecules, Vol. 35, 2002, pp. 2277).

The diamine component (A) used in the present invention may contain, in addition to the aforementioned essential ingredients (a1) and (a2), another diamine compound. Examples of such an additional diamine compound may include 4,4'-diaminodiphenyl ether, 3,4'-diaminodiphenyl ether, 3,3'-diaminodiphenyl ether, 2,4'-diaminodiphenyl ether, 2,3,5,6-tetramethyl-1,4-phenylenediamine, 2,3,5,6-tetraethyl-1,4-phenylenediamine, 2,5-dimethyl-1,4-phenylenediamine, 2,5-dimethyl-1,3-phenylenediamine, 2,5-diethyl-1,4-phenylenediamine, 2,5-diethyl-1,3-phenylenediamine, 1,4-phenylenediamine, 2,4,6-trimethyl-1,3-phenylenediamine, 2,4,6-triethyl-1,3-phenylenediamine, 1,3-phenylenediamine, 2,2'-dimethyl-4,4'-diaminobiphenyl, 4,4'-diaminodiphenylsulfone, 3,4'-diaminodiphenylsulfone, 3,3'-diaminodiphenylsulfone, 4,4'-diaminodiphenylsulfide, 3,4'-diaminodiphenylsulfide, 3,3'-diaminodiphenylsulfide, bis(4-(3-aminophenoxy)phenyl)sulfone, bis(4-(4-aminophenoxy)phenyl)sulfone, bis(4-(4-aminophenoxy)phenyl)sulfide, bis(4-(3-aminophenoxy)phenyl)sulfide, 4,4'-diaminodiphenylmethane, 2,4'-diaminodiphenylmethane, 3,4'-diaminodiphenylmethane, 3,3'-diaminodiphenylmethane, 2-bis(4-(4-aminophenoxy)phenyl)propane, 2,2-bis(4-(4-aminophenoxy)phenyl)hexafluoropropane, 2,2-bis(4-(3-aminophenoxy)phenyl)hexafluoropropane, 2,2-bis(4-aminophenoxy)hexafluoropropane, 1,6-hexamethylenediamine, 1,8-octamethylenediamine, 1,10-decamethylenediamine, 1,12-dodecamethylenediamine, isophthalic acid dihydrazide, adipic acid dihydrazide, sebacic acid dihydrazide, 2,6-naphthoic acid dihydrazide, 1,3-di(3-aminopropyl)-1,1,3,3-tetramethyl disiloxane, and cis-1,4-cyclohexyldiamine. One species thereof may be solely used, and two or more species thereof may also be used in combination.

When a component other than the aforementioned essential ingredients (a1) and (a2) is co-used in the diamine component (A) in the present invention, that component is preferably an alicyclic or aliphatic diamine compound for reducing the birefringent properties of the resulting polyimide film.

(Acid Dianhydride Component (B))

An alicyclic tetracarboxylic dianhydride may be encompassed in the aliphatic tetracarboxylic dianhydride that is an essential ingredient of the acid dianhydride component (B) used in the present invention. Examples of such an aliphatic tetracarboxylic dianhydride (b1) may include 1,2,3,4-butane tetracarboxylic dianhydride, 1,2,3,4-cyclobutane tetracarboxylic dianhydride, 1,2,3,4-cyclopentane tetracarboxylic dianhydride, 1,2,4,5-cyclohexane tetracarboxylic dianhydride, bicyclo(2,2,2)octa-7-ene-2,3,5,6-tetracarboxylic dianhydride, bicyclo(2,2,2)octane-2,3,5,6-tetracarboxylic dianhydride, 3,4-dicarboxy-1,2,3,4-tetrahydro-1-naphthalenesuccinic dianhydride, 1,3-cyclohexane bistrimellitic dianhydride, 1,4-cyclohexane bistrimellitic dianhydride, and 1,2-cyclohexane bistrimellitic dianhydride. One species thereof may be solely used, and two or more species thereof may also be used in combination. Since these compounds are aliphatic or alicyclic compounds, they are effective for improving light transmittance and for reducing birefringent properties.

Of the aforementioned aliphatic tetracarboxylic dianhydrides, tetracarboxylic dianhydrides having aliphatic rings are preferred for improving the light transmittance of a polyimide film and for reducing its birefringent properties, and 3,3',4,4'-bicyclohexyl tetracarboxylic dianhydride is particularly preferred.

The content of the aliphatic tetracarboxylic dianhydride (b1) in the acid dianhydride component (B) may preferably be 5 mol % or more and 95 mol % or less, and more preferably be 5 mol % or more and 50 mol % or less.

Examples of the aromatic tetracarboxylic dianhydride (b2), which is an essential ingredient of the acid dianhydride component (B) used in the present invention, may include pyromellitic dianhydride, 3,3',4,4'-benzophenone tetracarboxylic dianhydride, 3,3',4,4'-biphenyltetracarboxylic dianhydride, 3,3',4,4'-diphenyl ether tetracarboxylic dianhydride, 2,2-bis(3,4-dicarboxylphenyl)hexafluoropropanoic dianhydride, octyl succinic dianhydride, dodecyl succinic dianhydride, octyl malonic dianhydride, dimethylene bistrimellitic dianhydride, trimethylene bistrimellitic dianhydride, tetramethylene bistrimellitic dianhydride, pentamethylene bistrimellitic dianhydride, hexamethylene bistrimellitic dianhydride, octamethylene bistrimellitic dianhydride, decamethylene bistrimellitic dianhydride, dodecamethylene bistrimellitic dianhydride, hexadecamethylene bistrimellitic dianhydride, methylene-1,2-bis(1,3-dihydro-1,3-dioxo-5-isobenzofuranyl)diether, and propylene-1,3-bis(1,3-dihydro-1,3-dioxo-5-isobenzofuranyl)diether. One species thereof may be solely used, and two or more species thereof may also be used in combination.

In the reaction performed in the present invention, the ratio of the number of moles of the diamine component (A) with respect to the number of moles of the acid dianhydride component (B), i.e. the ratio (A/B) that is (the number of moles of the diamine component (A))/(the number of moles of the acid dianhydride component (B)), is set in the range of usually 0.9 to 1.1, preferably 0.95 to 1.05, and more preferably 0.97 to 1.03.

(Solvent Component (C))

The solvent component (C) used for the polyimide precursor composition of the present invention is an inert solvent and does not necessarily dissolve all the monomers of the components (A) and (B). However, preferably, the solvent dissolves the polyimide precursor produced. Examples of such a solvent may include N-methyl-2-pyrrolidone, N,N-dimethylformamide, N,N-dimethylacetamide, γ-butyrolactone, ε-caprolactone, γ-caprolactone, γ-valerolactone, dimethylsulfoxide, 1,4-dioxane, and cyclohexanone. These may be used in combination of two or more.

Examples of the solvent component (C) used for adjusting the viscosity of the produced polyimide precursor composition may include propylene glycol monomethyl ether, propylene glycol monoethyl ether, propylene glycol monomethyl acetate, propylene glycol monoethyl acetate, ethyl cellosolve, butyl cellosolve, toluene, xylene, ethanol, isopropyl alcohol, and n-butanol. These may be used in combination of two or more.

Thermal coloring of the synthesized polyimide precursor composition during heating can be suppressed by capping the terminal diamines of the polyimide precursor with an acid anhydride, so that a transparent polyimide film can be obtained. Examples of the acid anhydride used for capping the terminal diamines may include phthalic anhydride, tetrahydrophthalic anhydride, succinic anhydride, maleic anhydride, cyclohexane dicarboxylic acid, cis-norbornene-endo-2,3-dicarboxylic acid, and acetic anhydride. These may be used in combination of two or more.

(Polyimide Precursor Composition)

When the polyimide precursor composition is a varnish containing the aforementioned solvent component, the concentration of the polyimide precursor in the polyimide precursor composition is in the range of usually 1 to 50 wt %, preferably 3 to 35 wt %, and more preferably 10 to 30 wt %. Concentration less than 1 wt % may give thin layer after application, which may not be sufficient for a flexible substrate. Concentration exceeding 50 wt % may give high viscosity, which may result in poor applicability.

Examples of the method for applying the polyimide precursor composition for forming a polyimide film may include a spin coating method, an immersion method, a flexographic printing method, an ink jet printing method, a spraying method, a potting method, and a screen printing method. Preferred among them for obtaining a thick layer having a thickness of 10 μm or more may be a bar coating method, a slit coating method, a screen printing method, a spin coating method, and the like.

A base body is used to form a coating film of the polyimide precursor composition. Examples of the base body may include: plastic substrates such as polyimide, polyamide, PEN, and PES substrates; glass substrates; silicon wafers; metal thin films such as stainless steel, aluminum, and copper films; electronic display glass substrates on which TFTs, amorphous silicon, or color filters are previously formed; and substrates for organic EL devices.

A solvent for improving wettability to the base body may be added to the polyimide precursor composition before the reaction for obtaining the polyimide precursor or after completion of the reaction. Examples of such a solvent may include ethyl cellosolve, ethyl cellosolve acetate, butyl cellosolve, butyl cellosolve acetate, xylene, toluene, diisobutyl ketone, solvesso 100, propylene glycol monomethyl ether, and propylene glycol monomethyl ether acetate.

(Other Components)

In order to improve the adhesion properties with a glass substrate, a silicon wafer, or a metal thin film, the polyimide precursor composition of the present invention may contain a coupling agent such as a silane coupling agent or a titanium coupling agent.

Examples of the coupling agent may include γ-aminopropyltriethoxysilane, γ-aminopropyltrimethoxysilane, γ-aminopropyltripropoxysilane, γ-aminopropyltributoxysilane, γ-aminoethyltriethoxysilane, γ-aminoethyltrimethoxysilane, γ-aminoethyltripropoxysilane, γ-aminoethyltributoxysilane, γ-aminobutyltriethoxysilane, γ-aminobutyltrimethoxysilane, γ-aminobutyltripropoxysilane, and γ-aminobutyltributoxysilane.

Examples of the titanium coupling agent may include γ-aminopropyltriethoxytitanium, γ-aminopropyltrimethoxytitanium, γ-aminopropyltripropoxytitanium, γ-aminopropyltributoxytitanium, γ-aminoethyltriethoxytitanium, γ-aminoethyltrimethoxytitanium, γ-aminoethyltripropoxytitanium, γ-aminoethyltributoxytitanium, γ-aminobutyltriethoxytitanium, γ-aminobutyltrimethoxytitanium, γ-aminobutyltripropoxytitanium, and γ-aminobutyltributoxytitanium. These may be used in combination of two or more. The amount of the coupling agent used is preferably 0.1 wt % or more and 3 wt % or less based on the amount of resin in the polyimide precursor composition.

(Deposition Method and Polyimide Film)

The polyimide precursor composition of the present invention forms a polyimide when heated, dried, and dehydrated for ring closure. The heating temperature may be arbitrary chosen within the range of usually 100 to 400° C., preferably 200 to 350° C., and more preferably 250 to 300° C.

The heating time is usually 1 minute to 6 hours, preferably 5 minutes to 2 hours, more preferably 15 minutes to 1 hour.

Examples of the atmosphere for curing may include air gas, nitrogen gas, oxygen gas, hydrogen gas, and a gas mixture of nitrogen and hydrogen. In order to suppress coloring of the surface of the cured film, nitrogen gas containing oxygen in a small concentration and a gas mixture of nitrogen and hydrogen are preferred. Nitrogen gas with an oxygen concentration of 100 ppm or less and a gas mixture of nitrogen and hydrogen with a hydrogen concentration of 0.5% or less are more preferred.

The polyimide formed has a thickness of usually 0.1 to 100 μm, preferably 5 to 50 μm, and more preferably 10 to 30 μm. A polyimide film is obtained by removing the obtained polyimide from the substrate.

The polyimide film can realize the following film characteristics: The transmittance of 400 nm light is 80% or more at a film thickness of 10 μm; the thermal expansion coefficient is 20 ppm/° C. or less in the range of 100° C. to 200° C.; the glass transition temperature is 250° C. or more; and the difference between the refractive index in TE mode and the refractive index in TM mode is 0.05 or less.

Since the polyimide film can realize the aforementioned superior film characteristics, it may be used as the transparent flexible films for a variety of electronic devices after size adjustment and, if necessary, treatments such as surface treatment. More specifically, the polyimide film may be used as a transparent flexible film used for electronic devices including electronic displays such as electronic paper, organic EL display devices, LED (light-emitting diode) lighting devices, and CMOS (complementary metal oxide semiconductor) sensors.

Moreover, the transparent flexible film of the present invention can be used as the transparent flexible substrates for electronic display devices including electronic displays such as electronic paper and organic EL display devices and as the protection films for LED lighting devices and CMOS sensors.

EXAMPLES

Examples of the present invention are shown hereinbelow. However, the following Examples are only for illustrating the present invention, and the present invention is not limited thereto.

Example 1

A 0.5 L four-neck glass flask was used under the flow of dry nitrogen at a flow rate of 30 mL/min. 310.49 g of N,N-dimethylacetamide (solvent component (C)) was added to a mixture of 32.024 g (0.1 mol) of 2,2'-bis(trifluoromethyl) benzidine ((a1) component) and 11.419 g (0.1 mol) of recrystallized trans-1,4-cyclohexyldiamine ((a2) component). The mixture was heated to 70° C. for dissolution.

Then 30.631 g (0.1 mol) of recrystallized 3,3',4,4'-bicyclohexyl tetracarboxylic dianhydride ((b1) component) and 29.421 g (0.1 mol) of 3,3',4,4'-biphenyltetracarboxylic dianhydride ((b2) component) were gently added to the mixture. The resultant mixture was stirred at 80° C. for 15 minutes, and then allowed to naturally cool down. The mixture was then stirred for 60 hours at room temperature to give a polyimide precursor composition (varnish) A having a viscosity of 130 poise and containing a polyimide precursor having a polystyrene equivalent molecular weight Mw of 133200. The polystyrene equivalent molecular weight was determined by gel permeation chromatography (GPC).

A 6 inch diameter silicon wafer having a silicon oxide layer formed on the surface thereof was spin-coated with the varnish A and heated at 200° C. for 0.5 hours and then at 300° C. for 0.5 hours in a vertical diffusion furnace (product name: μTF, product of Koyo Lindberg Co., Ltd.) in a nitrogen atmosphere, whereby a polyimide film having a thickness of about 15 μm was obtained on the silicon wafer. The polyimide film on the silicon wafer was removed therefrom by etching the silicon oxide layer with a 0.49% aqueous solution of hydrofluoric acid. As to the polyimide film thus obtained, transmittance of 400 nm wavelength light in which the transmittance was converted to a value at a film thickness of 10 μm, thermal expansion coefficient, glass transition temperature, and the difference in refractive index were measured using the methods described below, and the results are summarized in Table 1.

The light transmittance was measured using a light transmittance measurement apparatus (product name: U-3310) manufactured by Hitachi, Ltd. The thermal expansion coefficient was measured in an air atmosphere at a temperature rising rate of 5° C./min in the range of 100° C. to 200° C. using a thermomechanical analysis apparatus (product name: TMA-8310, manufactured by Rigaku Corporation). The glass transition temperature was measured in an air atmosphere at a temperature rising rate of 5° C./min using the thermomechanical analysis apparatus (product name: TMA-8310, manufactured by Rigaku Corporation). The birefringence difference was measured using "prism coupler model 2010" (product name, manufactured by Metricon Corporation). The refractive indices in the TE mode and TM mode at a wavelength of 1300 nm were measured, and the difference between the refractive index in the TM mode and the refractive index in the TE mode was taken as the birefringence difference.

The weight average molecular weight (Mw) was determined under the following conditions.
(Conditions for Measuring Weight Average Molecular Weight by GPC Method)
[Measurement Apparatus]
Detector: L4000UV manufactured by Hitachi, Ltd.
Pump: L6000 manufactured by Hitachi, Ltd.
C-R4A Chromatopac manufactured by Shimadzu Corporation
[Measurement Conditions]
Column: Gelpack GL-S300MDT-5 (manufactured by Hitachi Chemical Co., Ltd.)×2 columns
Eluent: THF/DMF=1/1 (volume ratio)
LiBr (0.03 mol/L), $H_3PO_4$ (0.06 mol/L)
Flow rate: 1.0 mL/min, detector: UV270 nm The measurement was performed using 1 mL of a solvent solution [THF/DMF=1/1 (volume ratio)] for 0.5 mg of polymer.

Example 2

A 0.5 L four-neck glass flask was used under the flow of dry nitrogen at a flow rate of 30 mL/min. 257.77 g of N,N-dimethylacetamide (solvent component (C)) was added to a mixture of 6.405 g (0.2 mol) of 2,2'-bis(trifluoromethyl)benzidine ((a1) component) and 20.554 g (0.18 mol) of recrystallized trans-1,4-cyclohexyldiamine ((a2) component). The mixture was heated to 70° C. for dissolution.

Then 3.063 g (0.01 mol) of recrystallized 3,3',4,4'-bicyclohexyl tetracarboxylic dianhydride ((b1) component) and 55.900 g (0.19 mol) of 3,3',4,4'-biphenyltetracarboxylic dianhydride ((b2) component) were gently added to the mixture. The resultant mixture was stirred at 80° C. for 15 minutes, and then allowed to naturally cool down. The mixture was then stirred for 72 hours at room temperature to give a polyimide precursor composition (varnish) B having a viscosity of 660 poise and containing a polyimide precursor having a polystyrene equivalent molecular weight Mw of 44000.

With the varnish B thus obtained, a coating layer was made, which was then heated at 200° C. for 0.5 hours and then at 300° C. for 0.5 hours using the same method as that in Example 1 under the same curing conditions as in Example 1 to give a polyimide film having a thickness of about 15 μm. As to the polyimide film thus obtained, the measurement results of transmittance of 400 nm light in which the transmittance was converted to a value at a film thickness of 10 μm, thermal expansion coefficient, glass transition temperature, and the difference in refractive index are summarized in Table 1.

Example 3

A 0.3 L four-neck glass flask was used under the flow of dry nitrogen at a flow rate of 30 mL/min. 120.0 g of dimethylacetamide was added to a mixture of 4.900 g (0.0153 mol) of 2,2'-bis(trifluoromethyl)benzidine ((a1) component) and 5.230 g (0.0458 mol) of recrystallized trans-1,4-cyclohexyldiamine. The mixture was heated to 70° C. for dissolution.

Then 8.988 g (0.03055 mol) of recrystallized 1,2,3,4-butanetetracarboxylic dianhydride (=BTCDA, (b1) component) and 6.053 g (0.03055 mol) of 3,3',4,4'-biphenyltetracarboxylic dianhydride ((b2) component) were gently added to the mixture. The resultant mixture was stirred at 80° C. for 15 minutes, and then allowed to naturally cool down. The mixture was then stirred for 72 hours at room temperature to give a polyimide precursor composition varnish C having a viscosity of 0.1 poise and a polystyrene equivalent molecular weight Mw of 12400.

The varnish C thus obtained was heated at 200° C. for 0.5 hours and then at 300° C. for 0.5 hours under the same curing conditions as in Example 1 to give a polyimide having a thickness of about 10.4 μm. As to the polyimide film thus obtained, the measurement results of transmittance that was converted to a value at a film thickness of 10 μm, thermal expansion coefficient, glass transition temperature, and the difference in refractive index are summarized in Table 1.

Example 4

A 0.3 L four-neck glass flask was used under the flow of dry nitrogen at a flow rate of 30 mL/min. 120.0 g of dimethylacetamide was added to a mixture of 14.414 g (0.045 mol) of 2,2'-bis(trifluoromethyl)benzidine ((a1) component) and 1.713 g (0.015 mol) of recrystallized trans-1,4-cyclohexyldiamine ((a2) component). The mixture was heated to 70° C. for dissolution.

Then 9.458 g (0.045 mol) of recrystallized 1,2,3,4-cyclopentane tetracarboxylic dianhydride (=CPDA, (b1) component) and 4.414 g (0.015 mol) of 3,3',4,4'-biphenyltetracarboxylic dianhydride ((b2) component) were gently added to the mixture. The resultant mixture was stirred at 80° C. for 15 minutes, and then allowed to naturally cool down. The mixture was then stirred for 72 hours at room temperature to give a polyimide precursor composition varnish D having a viscosity of 1 poise and a polystyrene equivalent molecular weight Mw of 22400.

The varnish D thus obtained was heated at 200° C. for 0.5 hours and then at 300° C. for 0.5 hours under the same curing conditions as in Example 1 to give a polyimide having a thickness of about 14.1 μm. As to the obtained polyimide film thus obtained, the measurement results of transmittance that was converted to a value at a film thickness of 10 μm, thermal expansion coefficient, glass transition temperature, and the difference in refractive index are summarized in Table 1.

Comparative Example 1

A 0.5 L four-neck glass flask was used under the flow of dry nitrogen at a flow rate of 30 mL/min. 342.43 g of N,N-dimethylacetamide (solvent component (C)) was added to a mixture of 32.024 g (0.1 mol) of 2,2'-bis(trifluoromethyl) benzidine ((a1) component) and 11.419 g (0.1 mol) of recrystallized trans-1,4-cyclohexyldiamine ((a2) component). The mixture was heated to 70° C. for dissolution.

Then 58.842 g (0.2 mol) of 3,3',4,4'-biphenyltetracarboxylic dianhydride ((b1) component) was gently added to the mixture. The resultant mixture was stirred at 80° C. for 15 minutes, and then allowed to naturally cool down. The mixture was then stirred for 72 hours at room temperature to give a polyimide precursor composition (varnish) E having a viscosity of 160 poise and containing a polyimide precursor having a polystyrene equivalent molecular weight Mw of 108600.

Using the varnish E and using the same method as that in Example 1 and the same curing conditions as in Example 1, a polyimide film was produced. As to the polyimide film thus obtained, measurement results of transmittance of 400 nm wavelength light in which the transmittance was converted to a value at a film thickness of 10 μm, thermal expansion coefficient, glass transition temperature, and the difference in refractive index are summarized in Table 1.

Comparative Example 2

A 0.5 L four-neck glass flask was used under the flow of dry nitrogen at a flow rate of 30 mL/min. 418.82 g of N,N-dimethylacetamide (solvent component (C)) was added to a mixture of 32.024 g (0.1 mol) of 2,2'-bis(trifluoromethyl) benzidine ((a1) component) and 11.419 g (0.1 mol) of recrystallized trans-1,4-cyclohexyldiamine ((a2) component). The mixture was heated to 70° C. for dissolution.

Then 61.262 g (0.2 mol) of 3,3',4,4'-bicyclohexyl tetracarboxylic dianhydride ((b1) component) was gently added to the mixture. The resultant mixture was stirred at 80° C. for 15 minutes, and then allowed to naturally cool down. The mixture was then stirred for 72 hours at room temperature to give a polyimide precursor composition (varnish) F having a viscosity of 35 poise and containing a polyimide precursor having a polystyrene equivalent molecular weight Mw of 44500.

Using the varnish F and using the same method as that in Example 1 and the same curing conditions as in Example 1, a polyimide film was produced. As to the polyimide film thus obtained, measurement results of transmittance of 400 nm wavelength light in which the transmittance was converted to a value at a film thickness of 10 μm, thermal expansion coefficient, glass transition temperature, and the difference in refractive index are summarized in Table 1.

Comparative Example 3

A 0.5 L four-neck glass flask was used under the flow of dry nitrogen at a flow rate of 30 mL/min. 250.62 g of N,N-dimethylacetamide (solvent component (C)) was added to 32.024 g (0.1 mol) of 2,2'-bis(trifluoromethyl)benzidine ((a1) component). The mixture was heated to 70° C. for dissolution.

Then 30.631 g (0.1 mol) of 3,3',4,4'-bicyclohexyl tetracarboxylic dianhydride ((b1) component) was gently added to the mixture. The resultant mixture was allowed to naturally cool down. The mixture was then stirred for 72 hours at room temperature to give a polyimide precursor composition (varnish) G having a viscosity of 150 poise.

Using the varnish G and using the same method as that in Example 1 and the same curing conditions as in Example 1, a polyimide film was produced. As to the polyimide film thus obtained, measurement results for transmittance of 400 nm wavelength light in which the transmittance was converted to a value at a film thickness of 10 μm, thermal expansion coefficient, glass transition temperature, and the difference in refractive index are summarized in Table 1.

Comparative Example 4

A 0.3 L four-neck glass flask was used under the flow of dry nitrogen at a flow rate of 30 mL/min. 96.00 g of N,N-dimethylacetamide (solvent component (C)) was added to 6.517 g (0.057 mol) of recrystallized trans-1,4-cyclohexyldiamine ((a2) component). The mixture was heated to 70° C. for dissolution.

Then 17.483 g (0.057 mol) of 3,3',4,4'-bicyclohexyl tetracarboxylic dianhydride ((b1) component) was gently added to the mixture. The resultant mixture was stirred at 80° C. for 15 minutes, and allowed to naturally cool down. The mixture thus obtained was stirred for 24 hours at room temperature. However, the resulting mixture was in a gel form, and a polyimide precursor composition was not synthesized.

Comparative Example 5

A 0.5 L four-neck glass flask was used under the flow of dry nitrogen at a flow rate of 30 mL/min. 163.36 g of N,N-dimethylacetamide (solvent component (C)) was added to 11.419 g (0.1 mol) of recrystallized trans-1,4-cyclohexyldiamine ((a2) component). The mixture was heated to 70° C. for dissolution.

Then 29.421 g (0.1 mol) of 3,3',4,4'-biphenyltetracarboxylic dianhydride ((b2) component) was gently added to the mixture. The resultant mixture was allowed to naturally cool down. The mixture was then stirred for 72 hours at room temperature to give a polyimide precursor composition (varnish) H having a viscosity of 100 poise.

Using the varnish H and using the same method as that in Example 1 and the same curing conditions as in Example 1, a polyimide film was produced. As to the polyimide film thus obtained, measurement results of transmittance of 400 nm wavelength light in which the transmittance was converted to a value at a film thickness of 10 μm, thermal expansion coefficient, glass transition temperature, and the difference in refractive index are summarized in Table 1.

Comparative Example 6

A 0.5 L four-neck glass flask was used under the flow of dry nitrogen at a flow rate of 30 mL/min. 245.78 g of N,N-dimethylacetamide (solvent component (C)) was added to 32.024 g (0.1 mol) of 2,2'-bis(trifluoromethyl)benzidine ((a1) component), to achieve dissolution.

Then 29.421 g (0.1 mol) of 3,3',4,4'-biphenyltetracarboxylic dianhydride ((b2) component) was gently added to the mixture. The resultant mixture was stirred at room temperature for 48 hours to give a polyimide precursor composition (varnish) I having a viscosity of 140 poise and containing a polyimide precursor having a polystyrene equivalent molecular weight Mw of 72400.

Using the varnish I, and using the same method as that in Example 1 and the same curing conditions as in Example 1, a polyimide film was produced. As to the polyimide film thus obtained, measurement results of transmittance of 400 nm wavelength light in which the transmittance converted to a value at a film thickness of 10 μm, thermal expansion coefficient, glass transition temperature, and the difference in refractive index are summarized in Table 1.

whereas each Comparative Example lacks at least one of the four components. The differences in the film characteristics due to the ratio of the constituents, including the differences in the transmittance of 400 nm light, the thermal expansion coefficient, the glass transition temperature, and the difference in refractive index, are demonstrated in Table 1. That is, it is confirmed that a polyimide precursor composition that can form a polyimide film having film characteristics suitable for various electronic devices can be obtained when all the four components containing (a1), (a2), (b1), and (b2) components are contained as essential ingredients.

TABLE 1

| Example | Polystyrene equivalent (Mw) (—) | Light transmittance (400 nm, 10 μm-thickness) (%) | Thermal expansion coefficient (100-200° C.) (ppm/° C.) | Refractive index (1300 nm) TE | TM | Difference in refractive index Δn | Glass transition temperature (° C.) |
|---|---|---|---|---|---|---|---|
| 1 | 133200 | 80 | 20 | 1.5660 | 1.5547 | 0.0113 | 282 |
| 2 | 44000 | 83 | 7 | 1.5999 | 1.5592 | 0.0407 | 378 |
| 3 | 12400 | 81 | 20 | 1.5435 | 1.5369 | 0.0066 | 307 |
| 4 | 22400 | 82 | 18 | 1.5454 | 1.5390 | 0.0064 | 312 |
| Comp. Ex. 1 | 108000 | 62 | 20 | 1.6303 | 1.5576 | 0.0727 | 292 |
| Comp. Ex. 2 | 144500 | 80 | 51 | 1.5234 | 1.5214 | 0.0020 | 262 |
| Comp. Ex. 3 | 60000 | 79 | 64 | 1.5213 | 1.5183 | 0.0030 | 274 |
| Comp. Ex. 4 | Synthesis unable | — | — | — | — | — | — |
| Comp. Ex. 5 | 42100 | 82 | 10 | 1.6487 | 1.5577 | 0.0910 | 400 |
| Comp. Ex. 6 | 72400 | 55 | 13 | 1.6110 | 1.5700 | 0.0410 | 330 |

The ratio of the constituents of the polyimide precursors in the polyimide precursor compositions in the aforementioned Examples and Comparative Examples are summarized as follows.
(Example 1) (a1) component/(a2) component=50/50
 (b1) component/(b2) component=50/50
(Example 2) (a1) component/(a2) component=10/90
 (b1) component/(b2) component=5/95
(Example 3) (a1) component/(a2) component=25/75
 (b1) component/(b2) component=50/50
(Example 4) (a1) component/(a2) component=75/25
 (b1) component/(b2) component=75/25
(Comparative Example 1) (a1) component/(a2) component=50/50
 (b1) component/(b2) component=0/100
(Comparative Example 2) (a1) component/(a2) component=50/50
 (b1) component/(b2) component=100/0
(Comparative Example 3) (a1) component/(a2) component=100/0
 (b1) component/(b2) component=100/0
(Comparative Example 4) (a1) component/(a2) component=0/100
 (b1) component/(b2) component=100/0
(Comparative Example 5) (a1) component/(a2) component=0/100
 (b1) component/(b2) component=0/100
(Comparative Example 6) (a1) component/(a2) component=100/0
 (b1) component/(b2) component=0/100

The differences in the ratio of the constituents between the Comparative Examples and Examples are as follows. In each Example, the polyimide precursor composition is formed of 4 components, i.e., the (a1), (a2), (b1), and (b2) components,

INDUSTRIAL APPLICABILITY

The polyimide film obtained using the polyimide precursor composition of the present invention has high transparency, low thermal expansion properties, high heat resistance, and low birefringent properties and can therefore be used as the flexible substrates for electronic displays, good flexible organic EL flexible substrates, and the protection films for LEDs and CMOS sensors. Accordingly, the industrial applicability of the polyimide film is very high.

The invention claimed is:
1. A polyimide precursor composition comprising a polyimide precursor having a structure formed by reacting (i) a diamine component (A), including a fluorine-containing aromatic diamine (a1) represented by the following chemical formula (I),

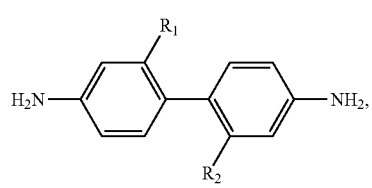

(I)

wherein in the formula (I), $R_1$ and $R_2$ are each independently selected from —H, —$(CF_2)_n$—$CF_3$, and —O$(CF_2)_n$—$CF_3$, wherein n is an integer of 0 or more and 7 or less, and at least one of $R_1$ and $R_2$ is a fluorine-containing group, and trans-1,4-cyclohexyldiamine (a2), with (ii) an acid dianhydride component (B) including an aliphatic tetracarboxylic dianhydride (b1) and an aromatic tetracarboxylic dianhydride (b2), and wherein the diamine component (A) includes the trans-1,4-cyclohexyldiamine (a2) in an amount of 50 mol % or more and 95 mol % or less, and wherein the aliphatic tetracarboxylic dianhydride (b1) is 3,3',4,4'-bicyclohexyl tetracarboxylic dianhydride, and the aromatic tetracarboxylic acid dianhydride (b2) is 3,3',4,4'-biphenyltetracarboxylic dianhydride.

2. The polyimide precursor composition according to claim 1, wherein the structure of the polyimide precursor is represented by the following general formula (III),

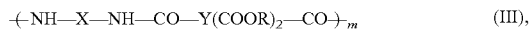
$$\text{—(NH—X—NH—CO—Y(COOR)}_2\text{—CO—)}_m \quad \text{(III)},$$

wherein in the formula (III), m is a natural number representing the number of repetitions of the structural unit, each of m X's is independently a divalent organic group, and the polyimide precursor comprises, as X's, both a group represented by the following general formula (IV),

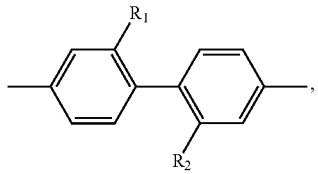

and a trans-1,4-cyclohexylene group, wherein $R_1$ and $R_2$ in the formula (IV) are each independently one selected from —H, —(CF$_2$)$_n$—CF$_3$, and —O(CF$_2$)$_n$—CF$_3$, wherein n is an integer of 0 or more and 7 or less, and at least one of $R_1$ and $R_2$ is a fluorine-containing group, and in the formula (III), each of m Y's is independently a tetravalent organic group, the polyimide comprises as Y's both an aliphatic group and an aromatic group, and each of 2m R's is independently a hydrogen atom or a monovalent organic group.

3. The polyimide precursor composition according to claim 1, wherein the diamine component (A) contains the fluorine-containing aromatic diamine (a1) in an amount of 5 mol % or more and 50 mol % or less.

4. The polyimide precursor composition according to claim 1, wherein the acid dianhydride component (B) contains the aliphatic tetracarboxylic dianhydride (b1) in an amount of 5 mol % or more and 95 mol % or less and the aromatic tetracarboxylic dianhydride (b2) in an amount of 95 mol % or less and 5 mol % or more.

5. The polyimide precursor composition according to claim 1, wherein a ratio (A/B) of the number of moles of the diamine component (A) with respect to the number of moles of the acid dianhydride component (B) is 0.9 to 1.1.

6. A polyimide precursor composition comprising a polyimide precursor having a structure represented by the following general formula (III),

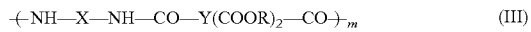
$$\text{—(NH—X—NH—CO—Y(COOR)}_2\text{—CO—)}_m \quad \text{(III)}$$

wherein in the formula (III), m is a natural number representing the number of repetitions of the structural unit, each of m X's is independently a divalent organic group, and the polyimide precursor comprises, as X's, both a group represented by the following general formula (IV),

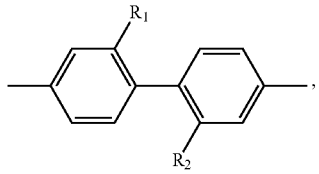

and a trans-1,4-cyclohexylene group, wherein $R_1$ and $R_2$ in the formula (IV) are each independently one selected from —H, —(CF$_2$)$_n$—CF$_3$, and —O(CF$_2$)$_n$—CF$_3$, wherein n is an integer of 0 or more and 7 or less, and at least one of $R_1$ and $R_2$ is a fluorine-containing group, and in the formula (III), each of m Y's is independently a tetravalent organic group, and the polyimide precursor comprises as Y's both an aliphatic group and an aromatic group, and each of 2m R's is independently a hydrogen atom or a monovalent organic group, and wherein —CO—Y(COOR)$_2$—CO— in formula (III) is derived from a mixture of 3,3',4,4'-bicyclohexyl tetracarboxylic dianhydride and 3,3',4,4'-biphenyltetracarboxylic dianhydride.

7. A polyimide film obtained using the polyimide precursor composition according to claim 1, wherein the polyimide film has a transmittance of 400 nm light of 80% or more at a film thickness of 10 μm, a thermal expansion coefficient of 20 ppm/° C. or less in the range of 100° C. to 200° C., and a glass transition temperature of 250° C. or more.

8. The polyimide film according to claim 7, wherein a difference between the refractive index in TE mode and the refractive index in TM mode is 0.05 or less.

9. A transparent flexible film obtained using the polyimide film according to claim 7.

10. The transparent flexible film according to claim 9, wherein the transparent flexible film is a transparent flexible substrate for an electronic device.

11. The transparent flexible film according to claim 9, wherein the transparent flexible film is a protection film for a lighting device.

12. The transparent flexible film according to claim 9, wherein the transparent flexible film is a protection film for a photoelectric sensor.

13. A polyimide film obtained using the polyimide precursor composition according to claim 6, wherein the polyimide film has a transmittance of 400 nm light of 80% or more at a film thickness of 10 μm, a thermal expansion coefficient of 20 ppm/° C. or less in the range of 100° C. to 200° C., and a glass transition temperature of 250° C. or more.

14. A polyimide film comprising a heat cured polyimide precursor composition, wherein the polyimide precursor composition comprises a polyimide precursor having a structure formed by reacting (i) a diamine component (A), including a fluorine-containing aromatic diamine (a1) represented by the following chemical formula (I),

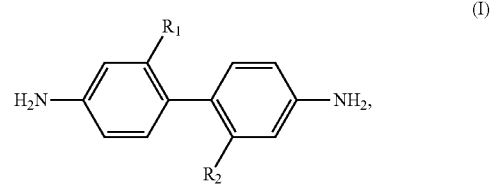

wherein in the formula (I), $R_1$ and $R_2$ are each independently selected from —H, —(CF$_2$)$_n$—CF$_3$, and —O(CF$_2$)$_n$—CF$_3$, wherein n is an integer of 0 or more and 7 or less, and at least one of $R_1$ and $R_2$ is a fluorine-containing group, and trans-1,4-cyclohexyldiamine (a2), with (ii) an acid dianhydride component (B) including an aliphatic tetracarboxylic dianhydride (b1) and an aromatic tetracarboxylic dianhydride (b2), wherein the aliphatic tetracarboxylic dianhydride (b1) is 3,3',4,4'-bicyclohexyl tetracarboxylic dianhydride, and the aromatic tetracarboxylic acid dianhydride (b2) is 3,3',4,4'-biphenyltetracarboxylic dianhydride, wherein the diamine component (A) includes the trans-1,4-cyclohexyldiamine (a2) in an amount of 50 mol % or more and 95 mol % or less, and wherein the polyimide film has a transmittance of 400 nm light of 80% or more at a film thickness of 10 μm, a thermal expansion coefficient of 20 ppm/° C. or less in the range of 100° C. to 200° C., and a glass transition temperature of 250° C. or more.

15. A polyimide precursor composition comprising a polyimide precursor having a structure formed by reacting (i) a diamine component (A), including a fluorine-containing aromatic diamine (a1) represented by the following chemical formula (I),

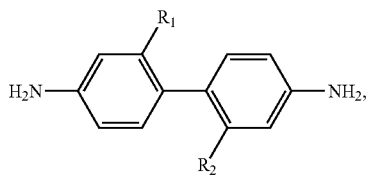

(I)

wherein in the formula (I), $R_1$ and $R_2$ are each independently selected from —H, —$(CF_2)_n$—$CF_3$, and —$O(CF_2)_n$—$CF_3$, wherein n is an integer of 0 or more and 7 or less, and at least one of $R_1$ and $R_2$ is a fluorine-containing group, and trans-1,4-cyclohexyldiamine (a2), with (ii) an acid dianhydride component (B) including an aliphatic tetracarboxylic dianhydride (b1) and an aromatic tetracarboxylic dianhydride (b2), and
wherein the diamine component (A) includes the trans-1,4-cyclohexyldiamine (a2) in an amount of more than 50 mol % and 95 mol % or less.

16. A polyimide film comprising a heat cured polyimide precursor composition, wherein the polyimide precursor composition comprises a polyimide precursor having a structure formed by reacting (i) a diamine component (A), including a fluorine-containing aromatic diamine (a1) represented by the following chemical formula (I),

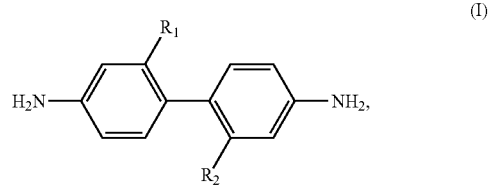

(I)

wherein in the formula (I), $R_1$ and $R_2$ are each independently selected from —H, —$(CF_2)_n$—$CF_3$, and —$O(CF_2)_n$—$CF_3$, wherein n is an integer of 0 or more and 7 or less, and at least one of $R_1$ and $R_2$ is a fluorine-containing group, and trans-1,4-cyclohexyldiamine (a2), with (ii) an acid dianhydride component (B) including an aliphatic tetracarboxylic dianhydride (b1) and an aromatic tetracarboxylic dianhydride (b2), wherein the aliphatic tetracarboxylic dianhydride (b1) is 3,3',4,4'-bicyclohexyl tetracarboxylic dianhydride, and the aromatic tetracarboxylic acid dianhydride (b2) is 3,3',4,4'-biphenyltetracarboxylic dianhydride, wherein the diamine component (A) includes the trans-1,4-cyclohexyldiamine (a2) in an amount of more than 50 mol % and 95 mol % or less, and
wherein the polyimide film has a transmittance of 400 nm light of 80% or more at a film thickness of 10 μm, a thermal expansion coefficient of 20 ppm/° C. or less in the range of 100° C. to 200° C., and a glass transition temperature of 250° C. or more.

* * * * *